United States Patent [19]

Murari et al.

[11] 3,911,327

[45] Oct. 7, 1975

[54] MOUNTING ASSEMBLY FOR INTEGRATED CIRCUITS HEAT SINK AND CLAMP MEANS

[75] Inventors: Bruno Murari; Giuseppe Cossuta; Sergio Orsucci, all of Milan, Italy

[73] Assignee: SGS ATES Componenti Elettronici SpA, Milan, Italy

[22] Filed: July 17, 1974

[21] Appl. No.: 489,172

[30] Foreign Application Priority Data

July 19, 1973 Italy .................................. 26760/73

[52] U.S. Cl. .............. 317/100; 174/DIG. 5; 357/79

[51] Int. Cl. .............................................. H05k 7/20

[58] Field of Search .. 317/100; 174/DIG. 3, DIG. 5, 174/15 R, 16 R, 52 PE; 357/79, 80, 81

[56] References Cited

UNITED STATES PATENTS

| | | | |
|---|---|---|---|
| 3,219,885 | 11/1965 | Schniers | 317/100 |
| 3,689,804 | 9/1972 | Ishihama | 317/100 |
| 3,812,557 | 5/1974 | Meyer | 357/79 |

OTHER PUBLICATIONS

IBM Tech. Discl. Bulletin, External Module Heat Sink Fastened to Board, Cunavelis and Ing, Vol. 14, No. 1, June 1971.

*Primary Examiner*—Gerald P. Tolin
*Attorney, Agent, or Firm*—Karl F. Ross; Herbert Dubno

[57] ABSTRACT

A mounting assembly for an integrated circuit comprises a synthetic-resin flexible spacer body having a face and unitarily formed with a pair of end regions having a predetermined height above the face and with a central region bridging the end regions and having a maximum height above the face smaller than the height of the end regions by a distance at most equal to the thickness of the integrated-circuit package to be mounted. Each of the end regions is formed with the throughgoing hole alignable with a similar hole in a heatsink plate and in a circuit board so that screws passing through each of these holes can clamp the end regions between the rigid heatsink plate and the circuit board with the central region pressing the integrated-circuit package resiliently against the heatsink plate.

9 Claims, 4 Drawing Figures

MOUNTING ASSEMBLY FOR INTEGRATED CIRCUITS HEAT SINK AND CLAMP MEANS

FIELD OF THE INVENTION

The present invention relates to a mounting assembly for an integrated circuit. More particularly this invention concerns an arrangement for securing an integrated circuit package and a heatsink to a printed-circuit board.

BACKGROUND OF THE INVENTION

An integrated circuit is usually incapsulated in a synthetic-resin body and provided with a so-called thermal mass having a face intended to disipate heat produced in the integrated circuit. The amount of heat energy which can be disipated by this thermal mass is often relatively limited so that in many high-power installations it is necessary to provide a heatsink on the integrated-circuit package in engagement with the thermal mass. Such heatsinks are generally rigid with the package and result in insufficient heat disipation for two main reasons. First of all some the contact feet penetrate more deeply into the holes in the printed circuit board than other contact feet. Secondly the surface of the package in contact with the heatsink is occasionally not perfectly smooth so that the heat-sink does not lie in direct heat-conducting relationship with this surface at all points. Such difficulties considerably reduce the heat-disipation capacity of the mounting assembly.

OBJECT OF THE INVENTION

It is therefore an object of the present invention to provide an improved semiconductor circuit assembly.

Another object is the provision of an improved mounting assembly for an integrated circuit.

Yet another object is to provide such an assembly which ensures good heat disipation by the heatsink so that the integrated circuit can operate with maximum efficiency.

SUMMARY OF THE INVENTION

These objects are attained according to the present invention in a semiconductor circuit assembly comprising an integrated circuit having a pair of opposite sides, and a heatsink plate engageable with one of the sides. A synthetic-resin flexible spacer body has a face on one side and is unitarily formed with a pair of end regions having a predetermined height above the face and with a central region extending between the end regions and having a maximum height above the face smaller than the height of the end regions by a distance at most equal to the thickness of the integrated-circuit package between its sides. Each of these end regions is formed with a throughgoing bore opening at the face of the body and alignable with holes in a circuit board engageable with the face. Clamping means is provided which is engageable through the bores and the holes for clamping the end regions between the heatsink plate and the circuit board and for pressing the one side of the package against the heatsink with the central region pressing against the other side of the package.

The assembly according to the present invention insures maximum heat disipation because the flexible spacer body resiliently presses the package against the underside of the heatsink so as to insure good thermal contact therebetween. In addition this spacer body, according to the present invention, is made of insulating material, preferably a thermoplastic synthetic resin such as a polyester, so that heat conduction between the integrated-circuit package and the circuit board is minimized.

In accordance with the present invention the face of the spacer body is secured to that side of the printed-circuit board which does not carry conductors. Thus the contact feet of the integrated-circuit package pass through respective holes in the circuit board and are soldered on the opposite side thereof to the respective conductors.

According to yet another feature of this invention the heatsink plate is similarly formed with a pair of holes alignable with the bores in the end regions and the holes in the circuit board so that the clamping means comprises screws which engage through these holes and bolt the assembly tightly and rigidly together.

In this manner the variations in thickness of the resin capsule containing the integrated-circuit are compensated for both by the elasticity of this spacer body and of the circuit board, this latter normally being a polyvinyl. These deformations create a resisting force which presses the thermal mass of the integrated circuit body tightly against the rigid metallic heat-sink at all times.

According to yet another feature of this invention the central region of the spacer body has an overall length generally equal to the overall length of the integrated-circuit package so that the end regions can flank this integrated-circuit package. In addition this central region is of maximum height at its middle and of lesser height toward the end regions. The central region is elongated and, according to yet another feature of this invention, has a width substantially narrower than the width of the end regions so as to impart to the spacer body a dumbbell-like shape allowing the integrated-circuit package to straddle this central region.

BRIEF DESCRIPTION OF THE DRAWING

The above and other objects, features, and advantages will become more readily apparent from the following, reference being made to the accompanying drawing in which.

SPECIFIC DESCRIPTION

Figure 1:
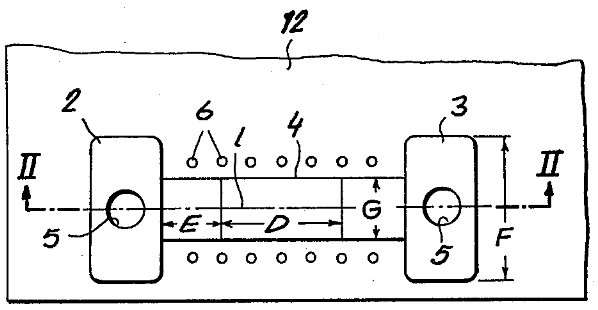
FIG. 1 is a top plan view of the spacer body and circuit board of the assembly in accordance with the present invention.

As shown in FIG. 1 a spacer body generally indicated at 1 has a planar face 1' adapted to engage the unclad surface 12' of a printed circuit board 12 formed with two rows of small-diameter holes 6. The body 1 is made unitarily of a single piece of polyester and has a pair of like end regions 2 and 3 bridged by a central region 4.

Figure 2:
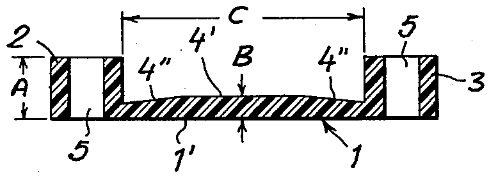
FIG. 2 is a longitudinal section through the spacer body corresponding generally to line II — II of FIG. 1.
Figure 3:
FIG. 3 is a side view of the spacer body according to this invention.

As also shown in FIGS. 2 and 3 each of the end regions 2 and 3 has a height A above the face 1' which is equal to approximately three times the maximum height B of the central region 4. In addition each of these end regions 2 and 3 has a width F transverse to the longitudinal center line l of the assembly which is equal to slightly more than twice the transverse width G of the uniformly wide central section 4. Furthermore this central region 4 is subdivided into a central section 4' flanked by two like end sections 4''. The central section 4' has a longitudinal length D which is equal to approximately twice as much as the longitudinal length E of each of the end sections 4'' which drop regularly from the maximum height B above the face 1' to a minimum height H equal to approximately 4/5B.

Figure 4:
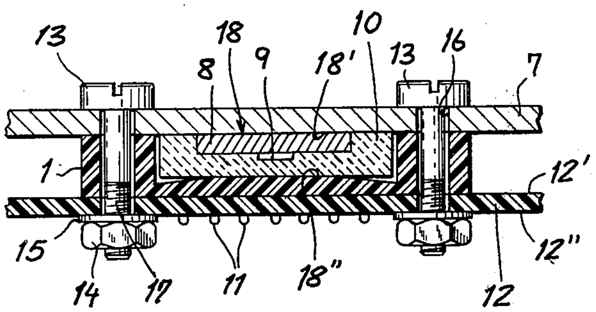
FIG. 4 is a longitudinal section through the complete assembly in accordance with this invention.

As shown in FIG. 4 the assembly has a heat sink plate 7 formed with a pair of like cylindrical bores 16 lineable with the bores 5 formed in the end regions 2 and 3 and with bores 17 formed in the printed-circuit board 12.

An integrated-circuit package 18 of generally parallele-pipedal shape with a planar upper surface 18' and lower surface 18'' comprises an integrated circuit chip 9 carried on a thermal mass 8 imbedded in a synthetic-resin block 10 having a length slightly shorter than the overall length C of region 4. This package 18 is of the L type as defined in *Linear Integrated Circuits Data Book* (1973: Motorola). The integrated circuit 18 has 14 contact feet 11 arranged in two rows of seven feet each, each of the feet 11 being receivable through a respective hole 6 so as to be soldered to the clad side 12'' of the circuit board 12. The screws 13 each provided with a nut 14 and lock washer 15 pass through the holes 16, 5, and 17 so as to clamp the end regions 2 and 3 between the aluminum heatsink plate 7 and the board 12 and so as to press the surface 18' of the integrated circuit 18 against the underside of the plate 7 by means of the resilient central region 4 of the spacer body 1. In this manner good heat-conducting contact is made between the thermal mass 8 and the heatsink 7. Deformations occur both in the central region 4 and in the printed circuit board 12 between the screws 13 which are well within the elastic limits of these elements so that they are in no way damaged. When clamped tightly, the circuit board 12 between the screws 13 frequently bend outwardly slightly away from the mounting assembly.

We claim:

1. A semiconductor circuit board assembly comprising:

an integrated-circuit package having a pair of opposite sides;

a heatsink plate engaged with one of said sides and provided with apertures;

a synthetic-resin flexible spacer body having a face and unitarily formed with a pair of end regions having a predetermined height above said face and with a central region extending between said end regions and having a maximum height above said face smaller than the height of said end regions by a distance at most equal to the thickness of said package between said sides, each end region being formed with a throughgoing bore at said face, said package being located in said central region between said sides;

a circuit board formed with holes aligned with said bores; and clamping means extending through said apertures, said bores and said holes, thereby gripping said end regions between said heatsink plate and said circuit board and thereby pressing said package with said central region against said heatsink plate.

2. The assembly defined in claim 1 wherein said body is insulating and thermoplatic.

3. The assembly defined in claim 2 wherein said face is substantially planar.

4. The assembly defined in claim 3 wherein said end regions are spaced apart by a distance greater than the overall length of said package.

5. The assembly defined in claim 4 wherein said central region has a minimum height adjacent said end regions less than said maximum height.

6. The assembly defined in claim 5 wherein said central region is subdivided into a middle section of said maximum height and a pair of end sections tapering from said maximum height to said minimum height, whereby when clamped against said other side of said integrated-circuit package only said middle section engages same.

7. The assembly defined in claim 6 wherein said body is elongated and said end regions have a width transverse to the longitudinal centerline of said body equal to approximately twice the corresponding transverse width of said central region.

8. The assembly defined in claim 1 wherein said clamping means includes a pair of screws each extending through a respective bore and hole, said board also being formed with a pair of bores alignable with said holes and receiving said screws.

9. The assembly defined in claim 1 wherein said body and said board are substantially more flexible than said heatsink plate.

* * * * *